United States Patent [19]

Schelten et al.

[11] Patent Number: 4,866,279
[45] Date of Patent: Sep. 12, 1989

[54] DEVICE FOR THE REFLECTION OF A LOW-ENERGY ION BEAM

[75] Inventors: Jakob Schelten; Ulrich Kurz, both of Jülich, Fed. Rep. of Germany

[73] Assignee: KFA Kernforschungsanlage Julich GmbH, Julich, Fed. Rep. of Germany

[21] Appl. No.: 256,858

[22] Filed: Oct. 12, 1988

[30] Foreign Application Priority Data

Oct. 12, 1987 [DE] Fed. Rep. of Germany ....... 3734423

[51] Int. Cl.⁴ .............................................. H01J 3/14
[52] U.S. Cl. .............................. 250/396 R; 328/229; 313/361.1
[58] Field of Search ................... 250/396 R; 328/229; 313/361.1, 306, 423, 432, 460

[56] References Cited

U.S. PATENT DOCUMENTS 4,079,285  3/1978  Little ........................ 250/396 R

FOREIGN PATENT DOCUMENTS 1223215  2/1971  United Kingdom ............... 328/229

OTHER PUBLICATIONS

Andrew, Journal of Physics E, vol. 7, No. 1, Jan. 1974, pp. 61–64.

*Primary Examiner*—Jack I. Berman
*Attorney, Agent, or Firm*—Herbert Dubno

[57] ABSTRACT

A device for the reflection of low-energy ions defines an ion guide with an array of electrode elements elongated transversely to the direction of the ion beam and in closely spaced relationship with the alternating electrode elements having the same potential but opposite polarity.

9 Claims, 4 Drawing Sheets

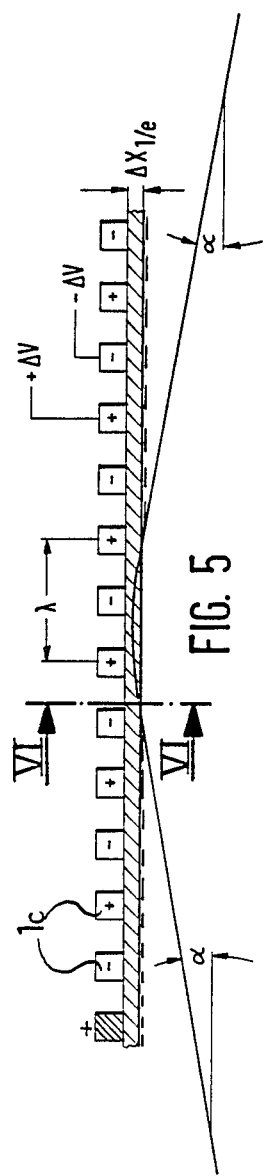
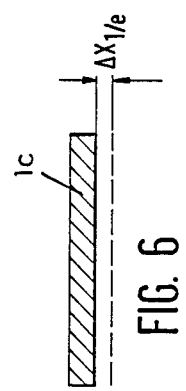
FIG. 5
FIG. 6

DEVICE FOR THE REFLECTION OF A LOW-ENERGY ION BEAM

CROSS REFERENCE TO RELATED APPLICATION

This application is related to the commonly assigned, concurrently filed copending application Ser. No. 257,103 based upon open German application P37 34 442.0 of Oct. 12, 1987, and naming Jakob SCHELTEN, one of the present applicants, as the inventor.

FIELD OF THE INVENTION

My present application relates to a device for the reflection of low energy ions.

BACKGROUND OF THE INVENTION

While a variety of electromagnetic techniques have been used heretofore for the deflection of ion beams and such earlier proposals have involved various deflecting plate arrangements and the use of electrically energized coils, by and large it has not been possible heretofore in a simple and economical manner to provide an efficient device for the relatively precise reflection of a low-energy ion beam.

OBJECTS OF THE INVENTION

It is, therefore, the principal object of the present invention to provide an improved device by means of which low-energy ions can be reflected.

Another object of the invention is to provide an improved ion-beam reflector which can not only serve as a so-called ion mirror, but also can confine the ion beam in an ion guide.

SUMMARY OF THE INVENTION

These objects and others which become apparent hereinafter are attained, in accordance with the present invention by providing a multiplicity of elongated electrode elements, with the closest possible spacing, having their longitudinal sides parallel to one another and arranged in an array in which neighboring electrode elements are energized with electrical potential of opposite signs so that the signs of the electrical potentials along the array in the direction of travel of the ion beam alternating from electrode element to electrode element.

When we refer here to the minimum possible distance between adjacent electrodes, we mean the smallest distance which can be established between these electrodes without electrical arcing or discharge or breakdown therebetween.

The array and the entire guide formed by the array of electrode elements can be disposed in a high-vacuum chamber or space.

The reflector can be used wherever ion beam reflection and guidance is desired and, for example, in a device for irradiating large surfaces as described in the aforementioned copending application.

The reflection of the ions is effected at a small-thickness or boundary zone of the guide adjacent the electrodes of the array and formed in the vacuum space containing the ion beam.

According to a feature of the invention, the electrode elements laterally surround the ion beam and define an ion guide for the latter.

The individual electrode elements can be formed as rings which can be insulated from one another and collectively surround the ion beam.

According to a feature of the invention, the electrode elements laterally surround the ion beam and define an ion guide for the latter.

The individual electrode elements can be formed as rings which can be insulated from one another and collectively surround the ion beam.

In another embodiment of the invention, the electrode elements can be formed as rectangular frames along with one another and insulated from one another so that they will define an ion guide of rectangular cross section. It has been advantageous, further, to form the elements, rather than as discrete spaced-apart elements, as elements of a continuous coil so that the array can be constituted by a multicoil helix, preferably a double helix with the elements being respective turns of the coils. In this case, the turns of the two coils interdigitate with one another to provide electrode elements of alternating electrical potential sign (or polarity) along the beam path.

The ion guide formed by the array of electrode elements of the invention can be analogized to a light guide such as an optical fiber, formed from two materials with different indices of refraction and with which a light beam can be reflected at the boundary surface where the angle of incidence is less than the angle of incidence for total reflection.

Such light guides are used for wide-band low-loss piping of light, have flexible delivery of light, and enable distribution of light from one source to a plurality of sources in signal transmission and for a variety of other purposes. As in a light Pipe, thee is a reflection of an ion beam in accordance with the invention in a zone proximal to the boundary of the ion guide in the case in which the angle of incidence of the ion beam is less than a critical limiting angle. The ion guide of the invention likewise can be used for broad-beam, low-loss transmission of ion beams if desired in a flexible manner and in a nonstraight path.

The electrical field strength, which is greatest along the boundary of the ion guide, decays exponentially in accordance with the characteristic 1/e length in accordance with the relation $$x_{1/e} = \lambda/(2\pi)$$

wherein $\lambda/2$ is the center to center spacing between two adjoining electrodes and the $\lambda$ is the center to center spacing of two electrode elements of the same polarity or the periodicity of the arrangement of the electrode elements.

The reflection of the ion beam in the device of the invention is a reflection with the characteristic that the angle of incidence is equal to the angle of reflection when the incident angle $\alpha$ of the ion beam is less than a critical maximum angle $\alpha_c$ determined by the relationship $$\alpha_c = g/2 \cdot \Delta V/U.$$

The angles $\alpha$ and $\alpha_c$ are measured with respect to the axis of the ion guide path at any particular location.

In the foregoing relationship g is a geometry factor which depends upon the ratio between a width b of the spacing between two neighboring electrodes and twice the distance between two electrodes measured on a center to center basis, i.e. periodicity λ. For a first approximation, $g \approx 0.7.$ In this latter relationship, moreover, $\pm \Delta V$ is the potential applied to the electrode elements while U is the electrical potential in volts which corresponds to the kinetic energy eU of the ions where e is the elementary charge.

The limiting angle $\alpha_c$ for reflection does not depend on the periodicity λ.

The characteristic that the reflection has equal incident and reflection angles is independent of the energy of the ions, i.e. the deflection is not dispersive. The construction of the ion guide, however, must take into consideration the maximum field strength since that is dependent upon the periodicity. The maximum field strength $E_{max}$ is related to the potential $\pm \Delta V$ applied to the electrode elements and the periodicity λ in accordance with the relationship:

$E_{max} \approx 10 \cdot \Delta V / \lambda.$

With a curved ion guide, the radius of curvature R will be determined by the relationship:

$$R \geq \frac{2D}{(g/2 \cdot \Delta V/U)^2}$$

where:
R is the radius of curvature of the ion guide (preferably in mm);
D is the smallest diameter of the ion guide (preferably in mm);
$\pm \Delta V$ is the electrical potential applied to the electrode elements (in volts); and
U is the electrical potential (volts) given by the kinetic energy eU of the ions, where e is the elementary or electron charge.

Ion guides in accordance with the invention can be used for ions with low energy and ion beams of relatively large diameters. The relationship between the ion beam energy and the diameter has an upper limit defined by the relationship $U/D \leq 0.1 \text{ kV/mm},$ the latter applying only because there is a finite field strength at which there will be breakdown between the electrode elements.

As noted, ion guides in accordance with the invention can be utilized in apparatus for large-surface irradiation. It can be used to generate ion mixtures, utilizing an ion gain for vaporizing materials which are to be vapor deposited. It may also be used for reactive ion beam etching, e.g. of semiconductor substrates, whereby ions with energies of less than 1 KeV can be delivered from an ion source.

According to another feature of the invention, the electrode elements can be bars arranged in a planar array, or in a curved array to form planar or curved mirrors for the dispersion-free reflection of ion beams.

The device for the reflection of a beam of low-energy ions generically thus comprises:
an elongated electrode array extending generally in a direction of travel of a beam of low-energy ions incident upon the array, the array consisting essentially of a multiplicity of electrode elements elongated transversely to the direction, closely spaced in the direction and provided with mutually parallel long sides, the long sides of successive electrode elements along the array being juxtaposed with one another, the center-to-center spacing λ/2 of successive electrode elements, where λ is a periodicity of the electrodes in the direction, being a minimum consistent with maintenance of electrical potentials on the elements; and
means for applying electrical potentials ($\pm \Delta V$) of opposite sign to the successive electrode elements and of a magnitude sufficient to effect reflection of incident ions of the beam moving in the direction from the array as the ions approach respective electrode elements of the array.

BRIEF DESCRIPTION OF THE DRAWING

The above and other objects, features and advantages of the present invention will become more readily apparent from the following description, reference being made to the accompanying drawing in which:

FIG. 5 is a longitudinal section through an ion mirror according to the invention; and FIG. 6 is a section taken along the line VI—VI of FIG. 5.

SPECIFIC DESCRIPTION

Figure 1:
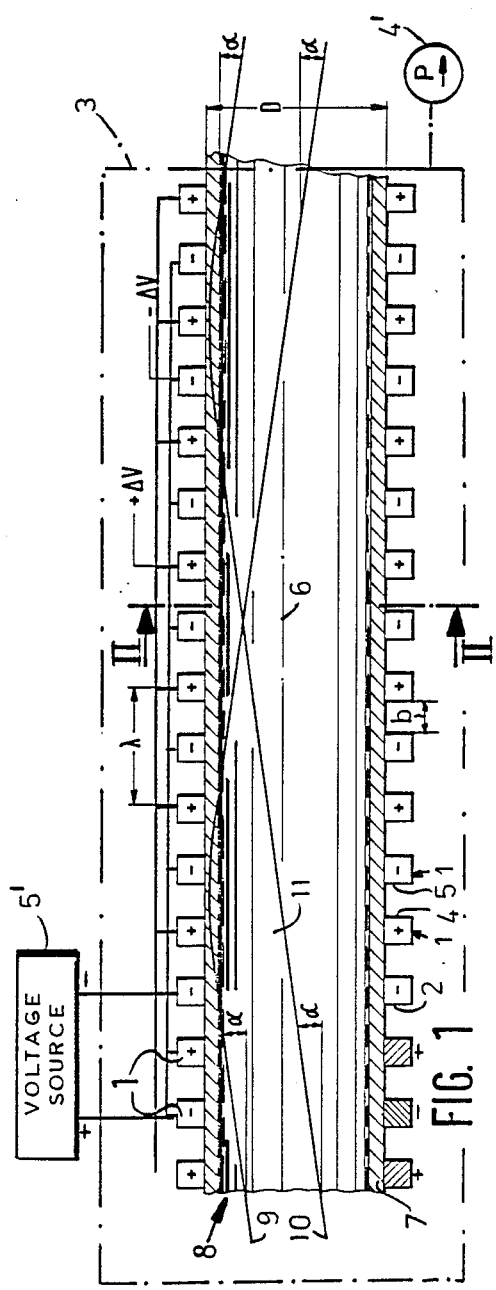
FIG. 1 is a highly diagrammatic longitudinal section through a linear ion guide according to the invention.
Figure 2A:
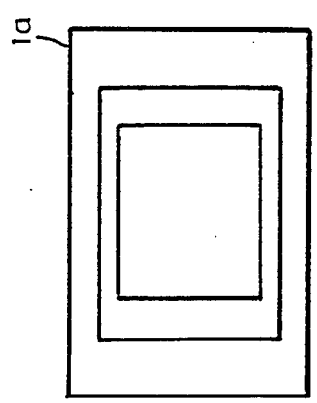
FIG. 2A is a view similar to FIG. 2 illustrating another embodiment of an ion guide in accordance with the invention.
Figure 2:
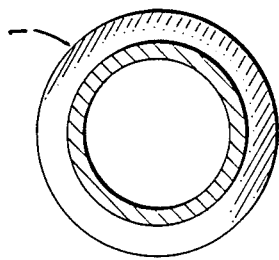
FIG. 2 is a cross section through the guide of FIG. 1 taken along the line II—II thereof.

In FIGS. 1 and 2, we have shown an ion guide formed by an array of axially aligned circular ring elements 1 constituting respective electrode elements and separated by spaces 2 of a width b, the center to center spacing of successive electrodes of the same polarity being represented at λ.

As represented by the dot-dash box 3, the space containing the ion guide is evacuated and a vacuum pump 4 has been shown for this purpose.

A voltage source 5 is connected to the electrode elements so that the alternating electrode elements have the same potential but of opposite sign or polarity.

Furthermore, the neighboring elements 1 have surfaces 4 and 5 which are generally parallel to one another and extend transversely of the axis 6 of the guide. FIG. 2A shows that the elements 1a of rectangular shape, i.e. in the form of rectangular frames, can be substituted for the circular rings of FIGS. 1 and 2. The spaces 2 between the electrode elements can be filled with dielectric electrical insulating spacers or can be insulated by vacuum.

The reflection zone has been represented at 7 along the outer region of the ion guide represented broadly at 8. Limiting pencils 9 and 10 of the ion beam 11 are also visible in FIG. 1.

Figure 3:
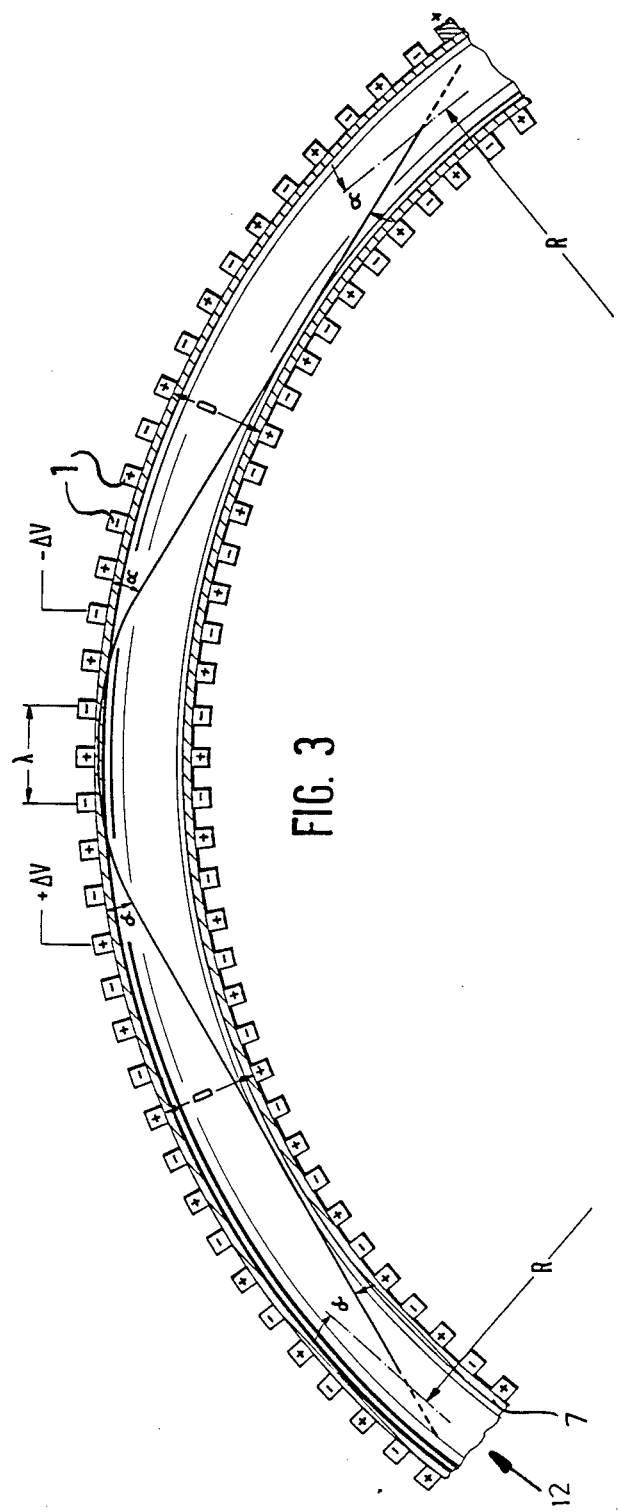
FIG. 3 is a longitudinal section through a curved ion guide.

In FIG. 3 it can be seen that the electrodes 1 are arranged in a curved guide path 12 so that the boundary region 7 for this ion guide is curved.

Figure 4:
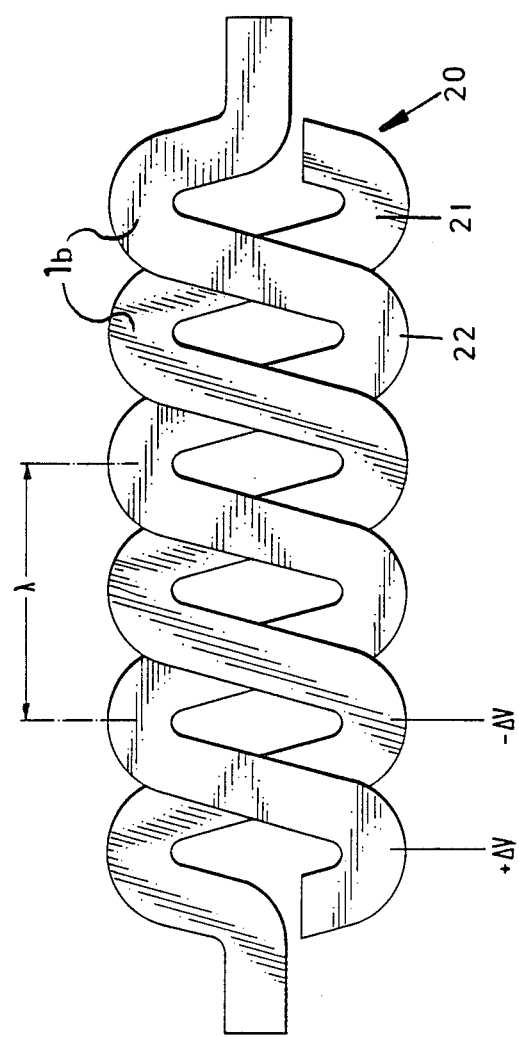
FIG. 4 is an elevational view of a linear ion guide with electrodes in the form of a double helix.

In FIG. 4, the successive electrode elements 1b of the ion guide are respective turns of a double helix 20 with the helices 21 and 22 having opposite polarity as indicated.

A planar array of bar-shaped electrode elements 1c can be seen in FIGS. 5 and 6 to form a planar mirror. This mirror can be curved as, for example, in the arrangement of FIG. 3.

Of course, in the embodiment of FIG. 3, rectangular frame electrode elements can be used instead of the circular electrode elements shown.

In FIGS. 1 and 2, the ion guide thus is formed by an arrangement of ring-shaped electrode elements 1 which are disposed parallel to one another with a periodicity $\lambda$ and a spacing b which is the minimum permitted by the potential applied thereto.

The electrical potentials $\pm\Delta V$ are applied to these electrodes with the signs of the potential alternating from electrode to electrode along the path of the beam. The diameter of the ion guide has been represented at D and the boundary or reflection zone 7 has a characteristic 1/e length in which the ions, incident at an angle $\alpha$ into the ion guide, are reflected. This zone has been shown by hatching for convenience. The 1/e length or width $\Delta x$ of this zone is $\lambda/2\pi$.

As can be seen from the drawing, the angle of incidence is equal to the angle of reflection or, cited otherwise, the angle at which the beam enters the guides is equal to the angle at which the beam leaves the guide.

FIG. 3, as noted, shows a guide for a curved path of the beam and the ion beam here also enters the guide at an angle $\alpha$ to the axis of the guide in the path direction Multiple reflections are thus permitted in this guide.

The radius of curvature of the guide has been represented at I and the boundary zone at which the reflection occurs is hatched here also. When the cross section of the ion guide is circular, i.e. when rings or helices are used to form the electrode array, the smallest diameter or minimum diameter of the guide is shown at D. The dimension D corresponds in principle to the width dimension in cross section of a rectangular cross section guide.

If the beam contains ions of an energy of 10 keV and the electrodes are energized with a potential of $\pm 10$kV, the limiting angle $\alpha = 0.35$ radian. With a periodicity of $\lambda = 20$ mm, the thickness $\Delta x$ of the boundary zone will be 3 mm and the maximum field strength 5 kV/mm. With an ion guide diameter D of 100 mm, the radius of curvature must be a minimum of 1.6 m.

Simple reflection on a planar array has been illustrated in FIG. 5 where again the angle of incidence is equal to the angle of reflection and in the reflecting layer of a thickness $\lambda/2\pi$, the ion beam is reflected in a dispersion-free manner.

We claim:

1. A device for the reflection of a beam of low-energy ions, comprising:
    an elongated electrode array extending generally in a direction of travel of a beam of low-energy ions incident upon said array, said array consisting essentially of a multiplicity of electrode elements elongated transversely to said direction, closely spaced in said direction and provided with mutually parallel long sides, the long sides of successive electrode elements along said array being juxtaposed with one another, the center-to-center spacing $\lambda/2$ of successive electrode elements, where $\lambda$ is a periodicity of said electrodes in said direction, being a minimum consistent with maintenance of electrical potentials on said elements, and
    means for applying electrical potentials ($\pm\Delta V$) of opposite sign to the successive electrode elements and of a magnitude sufficient to effect reflection of incident ions of said beam moving in said direction from said array as said ions approach respective electrode elements of said array.

2. The device defined in claim 1 wherein said elements are arranged so as to define a guide laterally surrounding said beam of ions.

3. The device defined in claim 2 wherein said elements are rings.

4. The device defined in claim 2 wherein said elements are rectangular frames.

5. The device defined in claim 2 wherein said elements are respective turns of a multicoil helix.

6. The device defined in claim 5 wherein said multicoil helix is a double helix.

7. The device defined in claim 2 wherein said guide is curved with a radius of curvature R defined by the relationship:

$$R \geq \frac{2D}{(g/2 \cdot \Delta V/U)^2}$$

where:
   g is a geometry factor depending upon the ratio between a gap spacing b between said elements and said periodicity $\lambda$;
   D is the minimum diameter of the ion guide;
   $\pm\Delta V$ is the electrical potential applied to said electrode elements in volts; and
   U is an electrical potential in volts corresponding to the kinetic energy eU of the ions, where e is the unit charge of an electron.

8. The device defined in claim 2 wherein said elements are bars defining a planar array 9. The device defined in claim 2 wherein said elements are parallel bars defining a curved array.

* * * * *